United States Patent [19]
Takatani et al.

[11] Patent Number: 5,841,584
[45] Date of Patent: Nov. 24, 1998

[54] DIELECTRIC MULTILAYERED REFLECTOR

[75] Inventors: Kunihiro Takatani, Kashiba; Toshiyuki Okumura, Tenri, both of Japan

[73] Assignee: Sharp Kabushiki Kaisha, Osaka, Japan

[21] Appl. No.: 639,989

[22] Filed: Apr. 26, 1996

[30] Foreign Application Priority Data

Apr. 26, 1995 [JP] Japan ..................................... 7-102471

[51] Int. Cl.⁶ ....................................................... G02B 1/10
[52] U.S. Cl. .............................. 359/586; 372/99; 359/584
[58] Field of Search ..................................... 359/580, 581, 359/582, 583, 584, 585, 586, 587, 588; 372/98, 99

[56] References Cited

U.S. PATENT DOCUMENTS 4,280,107  7/1981  Scifres ............................ 331/94.5 H
4,856,019  8/1989  Miyata et al. .......................... 372/99

FOREIGN PATENT DOCUMENTS 4-133486  5/1992  Japan .
6-97570   4/1994  Japan .

*Primary Examiner*—Georgia Y. Epps
*Assistant Examiner*—Dawn-Marie Bey
*Attorney, Agent, or Firm*—Morrison & Foerster, LLP

[57] ABSTRACT

The dielectric multilayered reflector of the invention is formed on at least one of two emitting surfaces of a semiconductor laser device. The dielectric multilayered reflector includes: a multilayered structure formed by stacking a plurality of layers; and a layer made of magnesium difluoride. In this dielectric multilayered reflector, the multilayered structure includes at least one layer made of an oxide dielectric material and the layer made of magnesium difluoride is formed on a surface of an outermost layer of the multilayered structure.

18 Claims, 5 Drawing Sheets

DIELECTRIC MULTILAYERED REFLECTOR

BACKGROUND OF THE INVENTION

1. Field of the Invention

The present invention relates to a dielectric multilayered reflector provided for an optical device. More specifically, the present invention relates to a dielectric multilayered reflector provided for the mirrors of a cavity of a semiconductor laser diode (LD).

2. Description of the Related Art

The mirrors of a cavity of a semiconductor LD are formed by etching or cleaving a semiconductor layer. However, since such mirrors of a cavity have a low reflectance by itself, a dielectric multilayered reflector is formed on at least one mirror of the cavity as a reflective mirror. The dielectric multilayered reflector is generally formed by alternately stacking a plurality of dielectric thin layers showing a low refractive index ($n_1$) and a plurality of dielectric thin layers showing a high refractive index ($n_2$) such that the optical thickness of each layer becomes one-fourth of the lasing wavelength of the laser, as shown in FIG. 4.

A dielectric thin layer material having a low refractive index is, for example, alumina ($Al_2O_3$), silicon dioxide ($SiO_2$), magnesium difluoride ($MgF_2$) or the like. On the other hand, a dielectric thin layer material having a high refractive index is, for example, titanium dioxide ($TiO_2$), zirconium dioxide ($ZrO_2$), zinc selenide (ZnSe), zinc sulfide (ZnS) or the like. These dielectric thin layer materials are described in Japanese Laid-Open Patent Publication No. 6-97570, for example.

The problems caused when $MgF_2$, ZnSe or ZnS is selected from the above-described materials as a material for a dielectric thin layer will be described. First, in the case of stacking multiple thin layers made of $MgF_2$ (hereinafter, referred to as an "$MgF_2$ layers"), cracks are disadvantageously caused by the internal stress of the $MgF_2$ layers. Similar cracks are observed both in the case of continuously stacking a plurality of $MgF_2$ layers and in the case of discontinuously stacking a plurality of $MgF_2$ layers with other kinds of layers sandwiched therebetween. In addition, even when a single-layered $MgF_2$ layer is formed, such problems are also caused if the thickness of the layer is increased. On the other hand, ZnSe is characterized by high toxicity. Furthermore, when ZnS is used, residual sulfur (S) in the chamber of the evaporator adversely deteriorates the quality of the other thin layers.

In contrast to these materials, an oxide dielectric such as silicon dioxide ($SiO_2$) is an effective material which is frequently used as a material for an optical thin layer without causing the above-described problems. However, since the surface of a layer made of an oxide dielectric (hereinafter, referred to as an "oxide dielectric layer") has a strong polarity, the refractive index of the oxide dielectric layer is likely to vary in the atmosphere with the passage of time. The reason for this problem is as follows.

In general, the strong polarity of the surface of an oxide dielectric layer not only dissociates water molecules contained in the air but it also easily adsorbs hydroxyl groups. Therefore, when the surface of an oxide dielectric layer is exposed to the air immediately after the layer has been deposited, the surface is rapidly covered with surface hydroxyl groups having hydrophilicity. Thereafter, the hydrogen bonds formed between the oxide dielectric layer and the surface hydroxyl groups gradually adsorb water molecules. Such an absorption of water molecules varies an apparent refractive index of the oxide dielectric layer with the passage of time. In addition, a dielectric thin layer deposited by a vacuum evaporation method or the like has a porous structure in which multiple vacancies are included in parallel to the layer thickness direction. Since the surface area of a dielectric thin layer having such a structure becomes larger than that of a bulk dielectric thin layer, the above-described variation of the refractive index is more likely to be accelerated with the passage of time.

For example, in the case of forming an alternately stacked multilayered reflector which includes $SiO_2$ layers having spectral characteristics as indicated by the solid line in FIG. 5 on a mirror of an LD immediately after the layer has been deposited, the abovedescribed adsorption of water molecules increases the refractive index of the $SiO_2$ layers with the passage of time. As a result, the optical thickness of the $SiO_2$ layers is increased, so that a full width at half maximum is increased to a certain degree and, at the same time, the reflection spectrum indicated by the solid line in FIG. 5 is shifted to the longer wavelength side to become a spectrum indicated by the broken line. Therefore, as shown in FIG. 5, the reflectance of the layer at the peak wavelength is decreased immediately after the layer has been deposited. Furthermore, since such a wavelength shift continuously changes with the passage of time, it is difficult to compensate such a variation after the layer is fabricated.

SUMMARY OF THE INVENTION

According to the present invention, a dielectric multilayered reflector which is formed on at least one of two emitting surfaces of a semiconductor laser device is provided. The dielectric multilayered reflector includes: a multilayered structure formed by stacking a plurality of layers; and a layer made of magnesium difluoride. In the dielectric multilayered reflector, the multilayered structure includes at least one layer made of an oxide dielectric material and the layer made of magnesium difluoride is formed on a surface of an outermost layer of the multilayered structure.

In one embodiment, the oxide dielectric material is at least one material selected from the group consisting of: silicon dioxide ($SiO_2$); titanium dioxide ($TiO_2$); zirconium dioxide ($ZrO_2$); and tantalum pentoxide ($Ta_2O_5$).

In another embodiment, the multilayered structure is formed by periodically stacking a plurality of layers having respectively different refractive indices.

In still another embodiment, the multilayered structure is formed by alternately stacking three pairs of layers made of silicon dioxide ($SiO_2$) and layers made of titanium dioxide ($TiO_2$).

According to the present invention, it is possible to keep stable the optical characteristics of a dielectric multilayered reflector, including as a layer component an oxide dielectric which is likely to adsorb water molecules, with the passage of time. In addition, a reflective mirror including a protective layer having high packing density and high mechanical strength can be formed on a mirror of a cavity. Therefore, a highly reliable and stable LD and other optical devices can be obtained.

The dielectric multilayered reflector of the invention is provided for a mirror of a cavity that may be formed by etching or cleaving a semiconductor laser device; includes an outermost surface layer made of $MgF_2$; and the layers other than the outermost surface layer include at least one oxide dielectric, thereby accomplishing the above-described objective.

In one embodiment, the dielectric multilayered reflector of the invention is formed such that the oxide dielectric used as a material for the layers other than the outermost surface layer includes at least one of $SiO_2$, $TiO_2$, $ZrO_2$ and $Ta_2O_5$.

In another embodiment, the dielectric multilayered reflector of the invention is formed such that the layers other than the outermost surface layer are formed by alternately stacking three pairs of $SiO_2$ layers and $TiO_2$ layers.

According to the present invention, the outermost surface layer of the dielectric multilayered reflector, including an oxide dielectric such as $SiO_2$, $TiO_2$, $ZrO_2$, and $Ta_2O_5$ as a layer component thereof, is made of $MgF_2$. Since $MgF_2$ dielectric has a highly dense structure and can prevent water molecules from penetrating or being adsorbed into the multilayered reflector, it is possible to keep stable the optical characteristics of the multilayered reflector with the passage of time.

$MgF_2$ is not included in the layers other than the outermost surface layer, and the $MgF_2$ layer can be formed to be thin enough to prevent a crack from being generated by the internal stress of the layer. For example, in the case of using the dielectric multilayered reflector for a mirror of an LD, the thickness of the $MgF_2$ layer can be set to be sufficiently thin, because it is only necessary for the optical thickness of the $MgF_2$ layer to be one-half of the lasing wavelength of an LD so that the reflectance of the dielectric multilayered reflector is always invariable with respect to the lasing wavelength. In addition, even when the thickness of the $MgF_2$ layer is required to contribute to determining the optical characteristics, the thickness can also be set to be sufficiently thin. Furthermore, since the $MgF_2$ thin layer has a high mechanical strength, a reflective mirror having a hard protective layer can be formed on a mirror of a cavity.

When the layers other than the outermost surface layer are formed by alternately stacking three pairs of $SiO_2$ layers and $TiO_2$ layers, it is possible to simultaneously improve the workability of the deposition process and the reflectance of the dielectric multilayered reflector.

Thus, the invention described herein makes possible the advantage of providing a dielectric multilayered reflector having invariable optical characteristics with the passage of time even though the layer includes an oxide dielectric as a component thereof.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
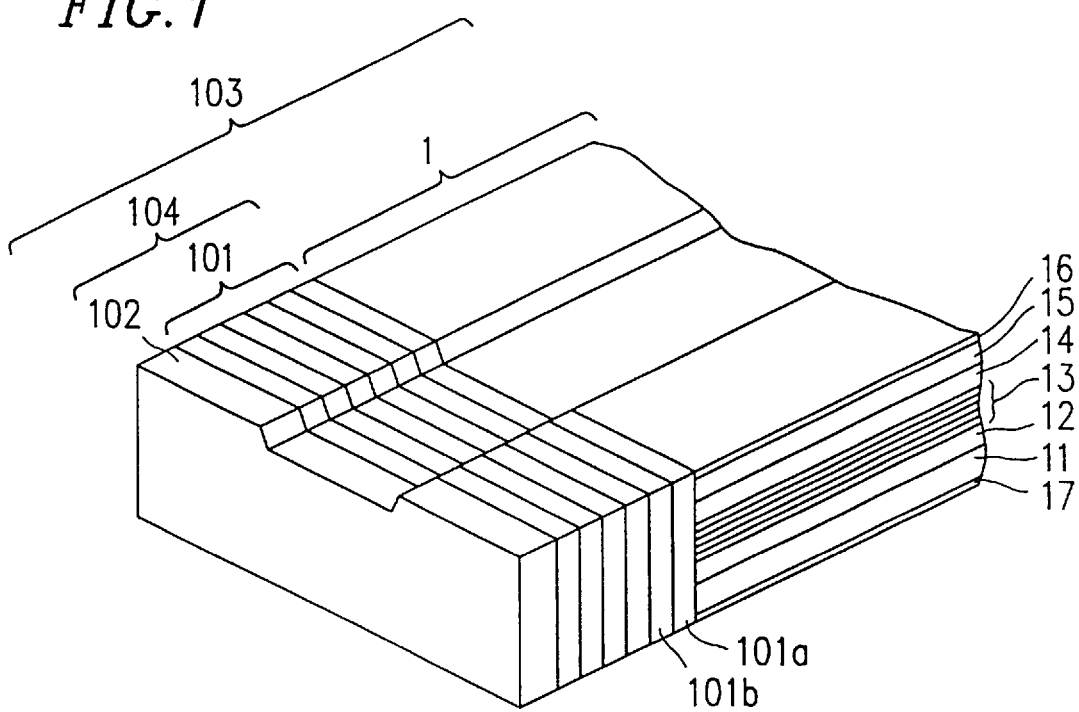
FIG. 1 is a perspective view showing one of the two mirrors of a semiconductor LD in a first example of the present invention.

A semiconductor laser diode 103 shown in FIG. 1 includes a cavity 1 and dielectric multilayered reflectors 104 which are provided on both of the emitting surfaces of the cavity 1. Each of the dielectric multilayered reflectors 104 includes an alternately stacked multilayered structure 101 and an outermost surface layer 102. In the cavity 1, a ZnSe buffer layer 12 is formed on a GaAs substrate 11, and a separation confinement heterojunction (SCH) structure 13 is formed on the buffer layer 12. In the SCH structure 13, an active layer is formed of a ZnCdSe multiple quantum well, a guide layer is made of ZnSe, and a cladding layer is made of ZnSSe. A ZnSe contact layer 14 is formed on the SCH structure 13 and a dielectric insulating layer 15, a part of which has been removed in a stripe shape, is formed on the contact layer 14. An upper electrode 16 is formed on the dielectric insulating layer 15, and a lower electrode 17 is formed on the lower surface of the substrate 11.

On each of the two emitting surfaces of the cavity 1, the alternately stacked multilayered structure 101 obtained by alternately stacking $SiO_2$ layers 101a and $TiO_2$ layers 101b and the outermost surface layer 102 made of $MgF_2$ are formed.

The semiconductor LD 103 having the above-described dielectric multilayered reflectors 104 is fabricated in the following manner. First, a ZnSe buffer layer 12, a ZnSSe lower cladding layer, a ZnSe lower guide layer, a ZnCdSe multiple quantum well active layer, a ZnSe upper guide layer, a ZnSSe upper cladding layer and a ZnSe contact layer 14 are epitaxially grown by a molecular beam epitaxy (MBE) method in this order on the GaAs substrate 11. Next, the dielectric insulating layer 15 is deposited by an electron beam (EB) deposition method and partially removed in a stripe shape by a mask patterning method. Then, the upper electrode 16 and the lower electrode 17 are formed on the dielectric insulating layer 15 and the lower surface of the substrate 11, respectively, by a resistance heating vacuum evaporation method, thereby fabricating a laser wafer for an electrode stripe type LD made of Group II–VI compound semiconductors.

Next, this laser wafer is cleaved or etched in a direction vertical relative to the stripe direction, thereby transforming the wafer into a bar shaped one. These cleaved or etched faces are used as emitting surfaces of the cavity 1.

Thereafter, the $SiO_2$ layers 101a and the $TiO_2$ layers 101b are alternately stacked by an EB deposition method on each mirror of the cavity 1 within a vacuum container, thereby forming the alternately stacked multilayered structure 101. The thickness of each layer is designed such that the optical thickness of the layer becomes one-fourth of the lasing wavelength of the cavity 1.

Three pairs of $SiO_2$ layers 101a and $TiO_2$ layers 101b, i.e., six layers in total, are alternately stacked. In this case, in order to enhance the adhesion strength among the dielectric thin layers 101a and 101b, a substrate (not shown) holding the cavity 1 thereon is heated to a temperature ranging from 100° to 150° C., which is lower than a generally used heating temperature of about 300° C. for forming a thin layer. The reason is as follows. The crystal growth temperature of a Group II–VI compound semiconductor is in the range from about 250° to 300° C. Therefore, if the ambient temperature is kept close to the crystal growth temperature for a long time, then the cavity 1 is likely to be affected by various effects such as the diffusion of dopants. Accordingly, it is preferable to set a temperature during various process steps except for the crystal growth process step at a temperature as low as possible.

Before starting to deposit $SiO_2$ and $TiO_2$ by the EB deposition method, the pressure inside the vacuum container is set to be $4 \times 10^{-6}$ Torr for both the materials and, during the deposition, the deposition rate of $SiO_2$ is maintained at 16 Å/sec. while the deposition rate of $TiO_2$ is maintained at 3.3 Å/sec. In addition, when $TiO_2$ is deposited, pure $O_2$ gas is introduced for compensating for oxygen atom vacancies and the pressure is maintained at $1.4 \times 10^{-4}$ Torr.

The outermost surface layer 102 made of $MgF_2$. is further stacked over the alternately stacked multilayered structure 101. The thickness of the $MgF_2$ layer is designed such that the optical thickness thereof becomes one-half of the lasing wavelength of the cavity 1, and the number of the $MgF_2$ layers to be stacked is set to be one. During the deposition of the outermost surface layer, in the same way as in depositing the alternately stacked multilayered structure, a substrate (not shown) holding the cavity 1 thereon is heated to a temperature ranging from 100° to 150° C. The deposition is performed while maintaining the deposition rate at 8 Å/sec. in a vacuum environment of $1 \times 10^{-5}$ Torr. Finally, the bar shaped laser wafer is divided into chip shaped pieces.

The cavity 1 has an lasing wavelength of 520 nm. If the $SiO_2$ layer (refractive index: 1.45), the $TiO_2$ layer (refractive index: 2.3) and the $MgF_2$ layer (refractive index: 1.36) of the dielectric multilayered reflector are deposited so as to be 89.66 nm thick, 56.52 nm thick and 191.18 nm thick, respectively, then the respective layers can satisfy the above-described wavelength conditions.

Figure 2:
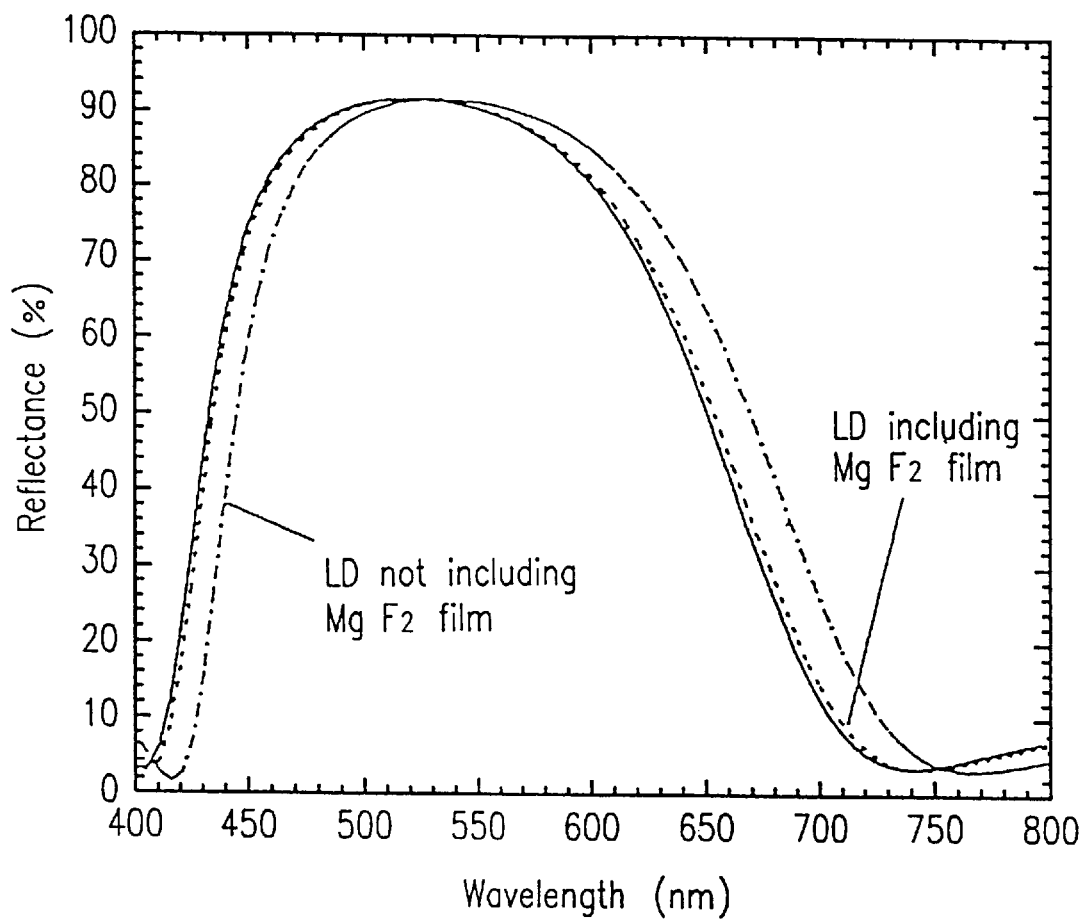
FIG. 2 is a graph showing in comparison the reflectance-wavelength characteristics of the semiconductor LD in the first example of the present invention and those of a semiconductor LD in a comparative example.

FIG. 2 shows the relationship between the reflectance at the mirrors of the semiconductor LD fabricated in the above-described manner and the wavelength. The refractive index of the active layer with respect to the lasing wavelength of the cavity 1 is about 2.7. Though not shown in FIG. 2, in the case where the alternately stacked multilayered structure 101 are not provided on the mirrors, the reflectance of the mirrors becomes as low as about 21%. However, by providing the alternately stacked multilayered structure 101 having a highly reflective characteristic as in this example, the reflective characteristics having a peak reflectance at the lasing wavelength (520 nm) of the laser can be obtained at the mirrors as indicated by the solid line in FIG. 2, and the peak reflectance becomes as high as 91%. By setting the reflectance at the mirrors to be high in this way, the reflection loss can be reduced, so that the reduction of the threshold current density can be expected.

The reasons why the alternately stacked multilayered structure 101 is formed of six layers by alternately stacking three pairs of $SiO_2$ layers and $TiO_2$ layers will be described below. In the case of applying a reflector obtained by alternately stacking $SiO_2$ layers and $TiO_2$ layers to a mirror of the cavity, a highly reflective characteristic sometimes cannot be obtained when the total number of layers is two or four. On the other hand, as the number of layers is increased to six, eight and so on, the resulting reflectance at the mirror is also increased. However, when the reflectance becomes too high, it becomes adversely difficult to emit light from the cavity. On the other hand, when the number of layers becomes too large, the fabrication process steps become adversely complicated and the time required for depositing such large a number of layers becomes disadvantageously long.

In this example, a combination of two kinds of materials exerting stress in opposite directions when these materials are vapor deposited are used as a combination of two kinds of dielectric materials for composing the alternately stacked multilayered structure 101. In general, the stress of the entire multilayered structure is estimated to be a total of the stresses of the respective layers. In the case where several pairs of dielectric layers of the two types are alternately stacked, the stress of the entire multilayered structure is obtained as a sum of the stresses of the respective pairs. Therefore, by selecting such a combination of two kinds of dielectric materials as that used in this example, it is possible to reduce the total stress of the alternately stacked multilayered structure 101. If the layers are stacked on the mirror of the LD device, the stress of the layers is to be applied to the mirror. In view of improving the LD device characteristics and the reliability thereof, it is important to reduce stress.

Next, referring to FIG. 2, it will be described how the reflective characteristics of the mirrors of a semiconductor LD including the dielectric multilayered reflector of this example may be varied with the passage of time. As a comparative example, a semiconductor LD in which dielectric multilayered reflector without an $MgF_2$ layer 102 is provided for the cavity 1 is also fabricated. The semiconductor LD including the dielectric multilayered reflector of this example and the semiconductor LD including the dielectric multilayered reflector of the comparative example are left in the atmosphere for 700 hours. and then the reflectance of the mirror is measured for both LDs. The resultant characteristics are indicated in FIG. 2. The dot line corresponds to the result of this example, while the one-dot chain line corresponds to that of the comparative example. The reflective characteristics of the mirror immediately after the dielectric multilayered reflector is fabricated for the cavity are indicated by the solid line in both this example and the comparative example.

It has been confirmed from the results shown in FIG. 2 that the oxide dielectrics $SiO_2$ and $TiO_2$. easily adsorb the water molecules in the atmosphere and are likely to vary the refractive index with the passage of time and that the variation of these characteristics with the passage of time can be effectively suppressed by providing the outermost surface layer 102 made of $MgF_2$ on these layers. In addition, since the $MgF_2$ layer exists nowhere except on the outermost surface and is sufficiently thin, cracks or the like owing to internal stress are not caused. The $MgF_2$ layer functions as a protective layer formed on the mirror of the cavity because the $MgF_2$. layer has a sufficiently high packing density and an excellent mechanical strength.

EXAMPLE 2

Figure 3:
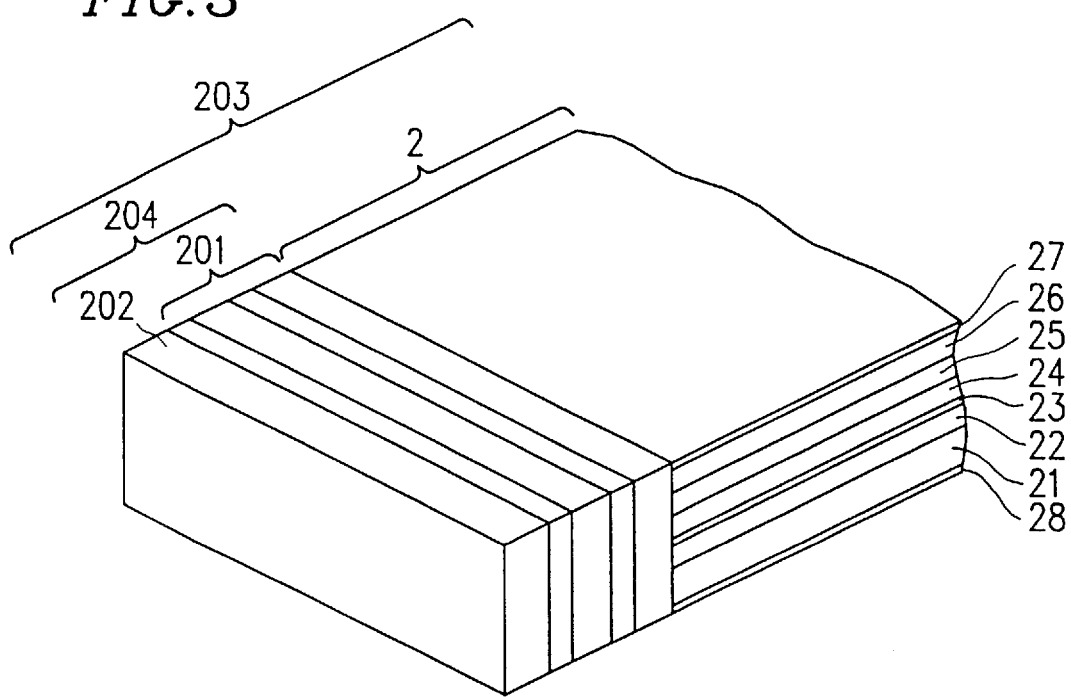
FIG. 3 is a perspective view showing one of the two mirrors of a semiconductor LD in a second example of the present invention.
Figure 4:
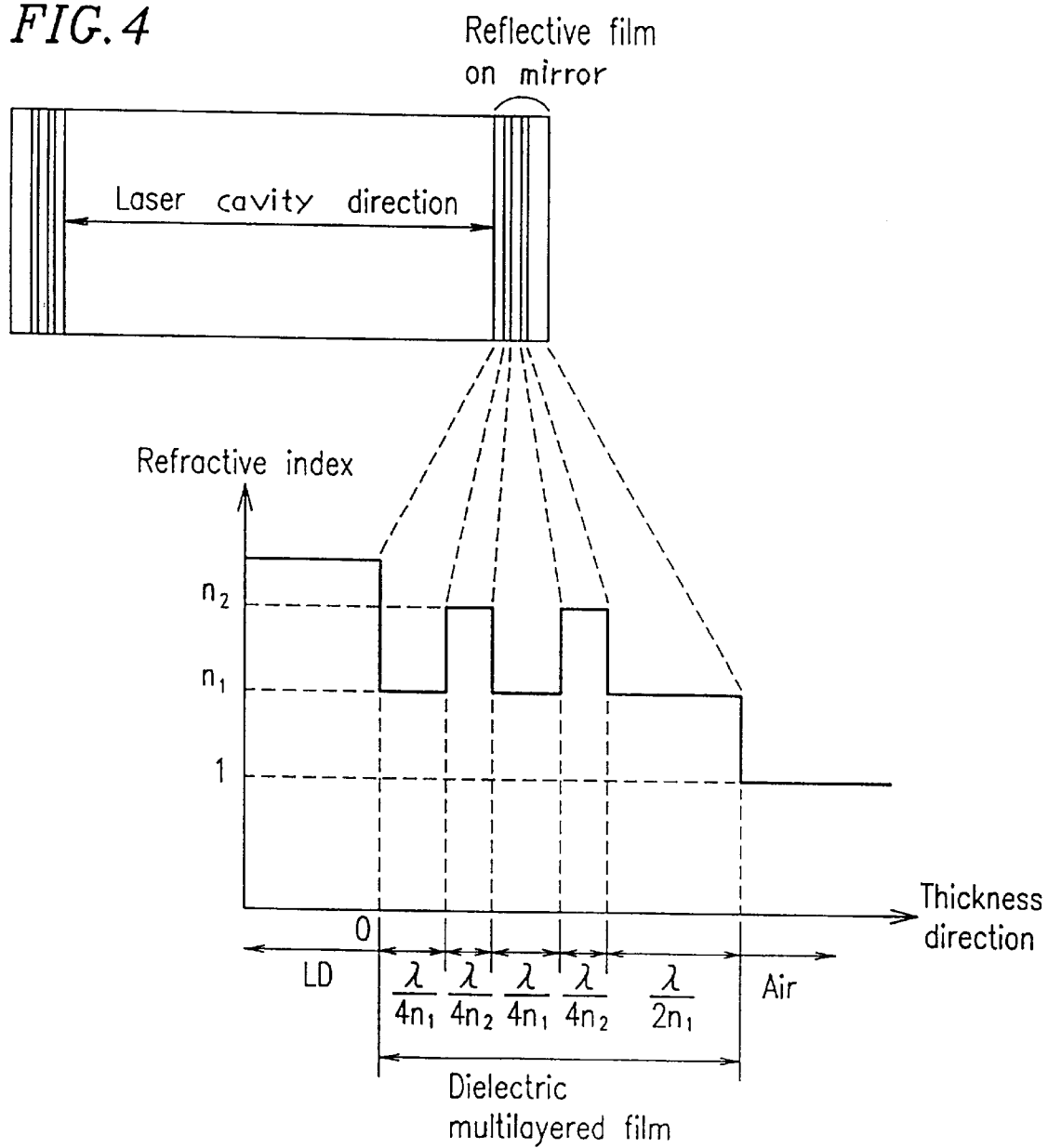
FIG. 4 is a schematic view showing a dielectric multi-layered reflector provided for a mirror of a cavity in a conventional semiconductor LD.
Figure 5:
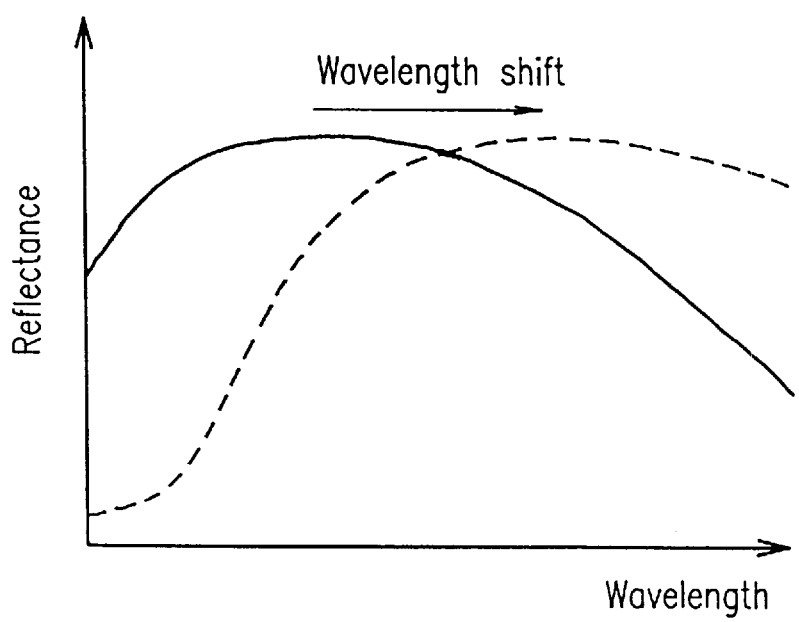
FIG. 5 is a graph showing the reflectance-wavelength characteristics of a conventional dielectric multilayered reflector.

A semiconductor laser diode 203 shown in FIG. 3 includes a cavity 2 and dielectric multilayered reflectors 204 which are provided on both of the emitting surfaces of the cavity 2. Each of the dielectric multilayered reflectors 204 includes an alternately stacked multilayered structure 201 and an outermost surface layer 202. The cavity 2 has a double hetero (DH) structure consisting of an AlGaAs lower cladding layer 22, an AlGaAs active layer 23 and an AlGaAs upper cladding layer 24 on a GaAs substrate 21. The upper surface of the upper cladding layer 24 has been partially removed in a stripe shape, and a GaAs blocking layer 25 and a GaAs contact layer 26 are formed over the substrate in such a state. A current confinement structure (not shown) is formed by the upper cladding layer 24, the blocking layer 25 and the contact layer 26. An upper electrode 27 is formed on the contact layer 26, and a lower electrode 28 is formed on the lower surface of the substrate 21.

On each of the two emitting surfaces of the cavity 2, the alternately stacked multilayered structure 201 obtained by alternately stacking $SiO_2$ layers 201a and Si layers 201b and the outermost surface layer 202 made of $MgF_2$ are formed.

The semiconductor LD 203 having the above-described dielectric multilayered reflector 204 is fabricated in the following manner. First, the AlGaAs lower cladding layer 22, the AlGaAs active layer 23 and the AlGaAs upper cladding layer 24 are grown in this order on the GaAs substrate 21 by a metalorganic chemical vapor deposition (MOCVD) method, thereby forming a DH structure. Next, the upper surface of the upper cladding layer 24 is selectively etched in a stripe shape. Thereafter, the GaAs blocking layer 25 and the GaAs contact layer 26 for confining the currents are grown again. Then, the upper electrode 27 and the lower electrode 28 are formed on the GaAs contact layer 26 and the lower surface of the substrate 21, respectively, by a resistance heating vacuum evaporation method, thereby fabricating a laser wafer for an inner stripe structure LD made of Group III–V compound semiconductors.

Next, the laser wafer in such a state is cleaved or etched in a direction vertical relative to the stripe direction, thereby transforming the wafer into a bar shaped one. These cleaved or etched faces are used as emitting surfaces of the cavity 2.

Thereafter, the $SiO_2$ layers and the Si layers are alternately stacked by an EB deposition method on each mirror of the cavity 2, thereby forming the alternately stacked multilayered structure 201. The thickness of each layer is designed such that the optical thickness of the layer becomes one-fourth of the lasing wavelength of the cavity 2. Two pairs of $SiO_2$ layers and Si layers, i.e., four layers in total, are alternately stacked. In this case, in order to enhance the adhesion strength among the dielectric thin layers, a substrate (not shown) holding the cavity 2 thereon is heated to a temperature ranging from 200° to 250° C. Before starting to deposit $SiO_2$ and Si, the pressure inside the vacuum container is set to be $4 \times 10^{-6}$ Torr for both the materials and, during the deposition, the deposition rate of $SiO_2$ is maintained at 16 Å/sec. while the deposition rate of Si is maintained at 10 Å/sec.

The outermost surface layer 202 made of $MgF_2$ is further stacked over the alternately stacked multilayered structure 201. The thickness of the $MgF_2$ layer is designed such that the optical thickness thereof becomes one-half of the lasing wavelength of the cavity 2, and the number of the $MgF_2$ layers to be stacked is set to be one. During the deposition of the outermost surface layer, in the same way as in depositing the alternately stacked multilayered structure, a substrate (not shown) holding the cavity 2 thereon is heated to a temperature ranging from 200° to 250° C. The deposition is performed while maintaining the deposition rate at 8 Å/sec. in a vacuum environment of $1 \times 10^{-5}$ Torr. Finally, the bar shaped laser wafer is divided into chip shaped pieces.

The cavity 2 has an lasing wavelength of 780 nm. If the $SiO_2$ layer (refractive index: 1.45), the Si layer (refractive index: 3.6) and the $MgF_2$ layer (refractive index: 1.36) of the dielectric multilayered reflector are deposited so as to be 134.48 nm thick, 54.17 nm thick and 286.76 nm thick, respectively, then the respective layers can satisfy the above-described wavelength conditions.

In the semiconductor LD 203 of this example fabricated in the above-described manner, the refractive index of the active layer with respect to the lasing wavelength of the cavity 2 is about 3.6, which is larger than the refractive index of the active layer in the first example. In addition, a difference between the refractive indices of the two kinds of dielectrics used for the alternately stacked multilayered structure 201 is also larger than that in the first example. Because of these reasons, a sufficiently high reflective characteristics can be obtained even if the number of layers in the alternately stacked multilayered structure 201 is set to be smaller than that in the alternately stacked multilayered structure 101 in the first example. In this example, a reflectance as high as 97% is obtained at the lasing wavelength (780 nm) of the laser.

Furthermore, since an outermost surface layer 202 made of $MgF_2$ is provided, the variation of the optical characteristics of the alternately stacked multilayered structure 201 can be suppressed with the passage of time. In addition, since the $MgF_2$ layer exists nowhere except on the outermost surface of the alternately stacked multilayered structure 201 and is sufficiently thin, a protective layer having a sufficiently high packing density and an excellent mechanical strength can be formed on the mirror of the cavity.

In the foregoing description, the present invention has been applied to the first and second examples. However, the present invention is not limited to these examples. For example, though an EB deposition method is used in the first and the second examples, a radio frequency sputtering method, a resistance heating vacuum evaporation method or any other deposition method can also be used.

In the first and the second examples, the thickness of each dielectric thin layer is designed so that the optical thickness thereof becomes one-fourth or one-half of the lasing wavelength of the laser. However, when a different kind of characteristics are desired, layers having different thicknesses can also be formed. Nevertheless, the thickness of the $MgF_2$ layer is required to be thin enough to prevent cracks from being caused by internal stress and thick enough to prevent water molecules from being adsorbed into the oxide dielectric layer, i.e., preferably in an approximate range from about 100 to about 600 nm.

In the first and the second examples, the dielectric multilayered reflectors are provided for both emitting surfaces of a cavity. Alternatively, it is possible to provide only one dielectric multilayered reflector on either emitting surface of the cavity.

In the first and the second examples, the cavity is assumed to have an electrode stripe structure or an inner stripe structure. However, the dielectric multilayered reflector of the invention is effectively applicable to an LD having a ridge waveguide structure or the like in view of controlling the side-mode losing.

In the foregoing examples, $SiO_2$ and $TiO_2$ are used as the oxides for composing an alternately stacked layer. Alternatively, zirconium dioxide ($ZrO_2$), tantalum pentoxide ($Ta_2O_5$) or other oxides can also be used.

In the first and the second examples, a ZnCdSe multiple quantum well layer and an AlGaAs active layer are respectively used as active layers determining the lasing wavelength of the laser. However, the dielectric multilayered reflector of the invention is naturally applicable to a case where an active layer which is made of any other material or has any other structure is formed for obtaining a different lasing wavelength. This is because an $MgF_2$ layer has a wide transmissible wavelength region ranging from an infrared ray transmissible region to an ultraviolet ray transmissible region.

Furthermore, the dielectric multilayered reflector of the invention is effectively applicable not only to a semiconductor LD such as those described in the first and the second examples, but also to other kinds of optical devices such as a light-emitting diode.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A dielectric multilayered reflector, which is formed on at least one of two emitting surfaces of a semiconductor laser device, comprising: a multilayered structure formed by stacking a plurality of layers on one of the emitting surfaces of the semiconductor laser device; and a layer made of magnesium difluoride, wherein the multilayered structure comprises at least one layer made of an oxide dielectric material and the layer made of magnesium difluoride is formed on a surface of an outermost layer of the multilayered structure.

2. A dielectric multilayered reflector according to claim 1, wherein the oxide dielectric material is at least one material selected from the group consisting of: silicon dioxide ($SiO_2$); titanium dioxide ($TiO_2$); zirconium dioxide ($ZrO_2$); and tantalum pentoxide ($Ta_2O_5$).

3. A dielectric multilayered reflector according to claim 1, wherein the multilayered structure is formed by periodically stacking a plurality of layers having respectively different refractive indices.

4. A dielectric multilayered reflector according to claim 1, wherein the multilayered structure is formed by alternately stacking three pairs of layers made of silicon dioxide ($SiO_2$) and layers made of titanium dioxide ($TiO_2$).

5. The dielectric multilayered reflector according to claim 1, wherein the semiconductor laser comprises a group II–VI compound semiconductor and wherein the plurality of layers of the multilayered structure are formed by an alternating EB deposition within a vacuum container at a temperature of about 100° C., to about 150° C., thereby enhancing the adhesion strength among the plurality of layers in the multilayer structure.

6. The dielectric multilayered reflector according to claim 5, wherein a pressure in the vacuum container is about $4 \times 10^{-6}$ Torr.

7. The dielectric multilayered reflector according to claim 5, wherein the EB deposition includes introducing oxygen for compensation of oxygen atom vacancies.

8. The dielectric multilayered reflector according to claim 1, wherein a thickness of the magnesium difluoride layer is such that an optical thickness of the magnesium difluoride layer is one-half of a lasing wavelength of the semiconductor laser device.

9. The dielectric multilayered reflector according to claim 5, wherein the semiconductor laser comprises a group II–VI compound semiconductor and wherein the magnesium difluoride layer is formed by an alternating EB deposition within a vacuum container at a temperature of about 100° C. to about 150° C., thereby enhancing the adhesion strength between the multilayered structure and the magnesium difluoride layer.

10. The dielectric multilayered reflector of claim 1, wherein the multilayered structure further comprises a plurality of alternating first and second layers, wherein the first layers have a higher refractive index than the second layers, and wherein the first layers exert stress in one direction and the second layers exert stress in an opposite direction, thereby reducing a total stress of the multilayered structure.

11. The dielectric multilayered reflector of claim 1, wherein the multilayered structure further comprises a plurality of alternating first and second layers, wherein the first layers have a refractive index of about 2.3 and the second layers have a refractive index of about 1.45.

12. The dielectric multilayered reflector of claim 1, wherein the magnesium difluoride layer has a refractive index of about 1.36.

13. The dielectric multilayered reflector of claim 11, wherein the semiconductor laser has a lasing wavelength of about 520 nm and the first layers each have a thickness of about 56.52 nm, the second layers each have a thickness of about 89.66 nm and the magnesium difluoride layer has a thickness of about 191.18 nm.

14. The dielectric multilayered reflector according to claim 1, wherein the semiconductor laser comprises a group III–V compound semiconductor and wherein the plurality of layers of the multilayered structure are formed by an alternating EB deposition within a vacuum container at a temperature of about 200° C., to about 250° C., thereby enhancing the adhesion strength among the plurality of layers in the multilayer structure.

15. The dielectric multilayered reflector according to claim 1, wherein the semiconductor laser comprises a group III–V compound semiconductor and wherein the magnesium difluoride layer is formed by an alternating EB deposition within a vacuum container at a temperature of about 200° C. to about 250° C., thereby enhancing the adhesion strength between the multilayered structure and the magnesium difluoride layer.

16. The dielectric multilayered reflector of claim 1, wherein the multilayered structure further comprises a plurality of alternating first and second layers, wherein the first layers have a refractive index of about 1.45 and the second layers have a refractive index of about 3.6.

17. The dielectric multilayered reflector of claim 16, wherein the semiconductor laser has a lasing wavelength of about 780 nm and the first layers each have a thickness of about 134.48 nm, the second layers each have a thickness of about 54.17 nm magnesium difluoride layer has a thickness of about 286.76 nm.

18. The dielectric multilayered reflector of claim 1, wherein the magnesium difluoride layer has a thickness of about 100 nm to about 600 nm.

* * * * *